United States Patent
Huang et al.

(10) Patent No.: US 7,755,406 B2
(45) Date of Patent: Jul. 13, 2010

(54) DUTY CYCLE CORRECTION CIRCUIT WITH WIDE-FREQUENCY WORKING RANGE

(75) Inventors: Hsien-Sheng Huang, Hsinchu (TW); Chun Shiah, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 121 days.

(21) Appl. No.: 12/273,557

(22) Filed: Nov. 19, 2008

(65) Prior Publication Data

US 2009/0261877 A1    Oct. 22, 2009

(30) Foreign Application Priority Data

Apr. 18, 2008    (TW) .............................. 97114243 A

(51) Int. Cl.
*H03K 3/017*    (2006.01)
*H03K 5/04*    (2006.01)
*H03K 7/08*    (2006.01)

(52) U.S. Cl. .................. 327/175; 327/147; 327/156; 327/158; 327/161

(58) Field of Classification Search ................ 327/156, 327/158, 175
See application file for complete search history.

(56) References Cited

U.S. PATENT DOCUMENTS 7,414,448 B2 *    8/2008    Huang et al. ................ 327/175

* cited by examiner

*Primary Examiner*—Lincoln Donovan
*Assistant Examiner*—John W Poos
(74) *Attorney, Agent, or Firm*—Winston Hsu

(57) ABSTRACT

A duty cycle correction circuit with wide-frequency working range utilizes a pulse generator having adjustable pulse width function to adjust the width of the pulse and outputs a clock signal with the duty cycle of 50%. The pulse generator includes a NAND gate, a modulation device, and an inverter. The inverter is coupled between the second input end of the NAND gate and the modulation device. The modulation device modulates the low-level status of the input clock signal and accordingly outputs to the inverter. The first input end of the NAND gate receives the input clock signal. The NAND gate operates NAND calculation to the signals received on the input ends of the NAND gate and accordingly outputs a periodic low-level pulse signal.

20 Claims, 6 Drawing Sheets

DUTY CYCLE CORRECTION CIRCUIT WITH WIDE-FREQUENCY WORKING RANGE

BACKGROUND OF THE INVENTION

1. Field of the Invention

The present invention relates to a duty cycle correction circuit, and more particularly, to a duty cycle correction circuit with wide-frequency working range.

2. Description of the Prior Art

Please refer to FIG. 1. FIG. 1 is a diagram illustrating a conventional duty cycle correction circuit 100. As shown in FIG. 1, the duty cycle correction circuit 100 comprises a duty cycle correcting device 110 and a delay lock loop circuit 120. The duty cycle correcting device 110 receives a reference clock signal $CLK_{IN}$, and accordingly generates a corrected clock signal $CLK_{DCC}$. The duty cycle of the corrected clock signal $CLK_{DCC}$ is 50%. The delay lock loop circuit 120 is coupled to the duty cycle correcting device 110 for receiving the corrected clock signal $CLK_{DCC}$ and accordingly generating a delayed corrected clock signal $CLK_{OUT}$. The delay lock loop circuit 120 requires a locking period $T_{L1}$ for leading the phase of the delayed corrected clock signal $CLK_{OUT}$ to the same phase of the corrected clock signal $CLK_{DCC}$. The duty cycle correcting device 110 requires a locking period $T_{L2}$ for leading the phase of the corrected clock signal $CLK_{DCC}$ to the same phase of the reference clock signal $CLK_{IN}$.

Therefore, according to the description above, the conventional duty cycle correction circuit 100 requires the sum of the locking periods $T_{L1}$ and $T_{L2}$ in order to lock the phase of the outputted delayed corrected clock signal $CLK_{OUT}$ to the same phase of the reference clock signal $CLK_{IN}$, which easily causes unstable status of the output clock signal $CLK_{OUT}$ because of the excessive requirement to lock. Furthermore, since there is no feedback mechanism in the duty cycle correction circuit 100, the delay period between output delayed corrected clock signal $CLK_{OUT}$ and the reference clock signal $CLK_{IN}$ is not traceable, causing inconvenience.

SUMMARY OF THE INVENTION

The present invention provides a duty cycle correction circuit with wide-frequency working range. The duty cycle correction circuit receives a reference clock signal from a clock generator and corrects duty cycle of the received reference clock signal for outputting an output clock signal, the duty cycle correction circuit comprises a modulation circuit, a delay circuit, and a PLL circuit. The modulation circuit comprises a pulse generator, and a modulation device. The pulse generator comprises a NAND gate and a first modulator. The NAND gate comprises a first input end coupled to the clock generator, a second input end, and an output end for outputting a periodic low-level pulse signal. The first modulator is coupled between the clock generator and the second input end of the NAND gate for modulating low-level status of the reference clock signal according to a reference voltage and accordingly outputting the modulated reference clock signal to the second input end of the NAND gate. The modulation device comprises at least one second modulator coupled to the output end of the NAND gate for modulating low-level status of the periodic low-level pulse signal according to the reference voltage and accordingly outputting the modulated periodic low-level pulse signal as the output clock signal. The delay circuit is coupled to one output end of the modulation device for delaying the output clock signal by a predetermined period and accordingly outputting a first corrected clock signal and a second corrected clock signal, wherein the first corrected clock signal and the second corrected clock signal are inverted to each other. The PLL circuit is coupled to the delay circuit for estimating high-level status and low-level status of the first corrected clock signal and the second corrected clock signal and accordingly generating the reference voltage.

The present invention further provides a duty cycle correction circuit for correcting duty cycle of a reference clock signal so as to generate an output clock signal. The duty cycle correction circuit comprises a modulation circuit, a delay circuit, and a PLL circuit, The modulation circuit receives the reference clock signal for generating the output clock signal according to a reference voltage. The delay circuit is disposed for generating a first corrected clock signal and a second corrected clock signal according to the output clock signal. The first corrected clock signal and the second corrected clock signal are inverted to each other. The PLL circuit is coupled to the delay circuit, for generating the reference voltage according to the first corrected clock signal and the second corrected clock signal. The modulation circuit comprises a pulse generator and a modulation device. The pulse generator generates a low-level pulse signal according to the reference clock signal and the reference voltage. The modulation device generates the output clock signal according to the low-level pulse signal and the reference clock signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
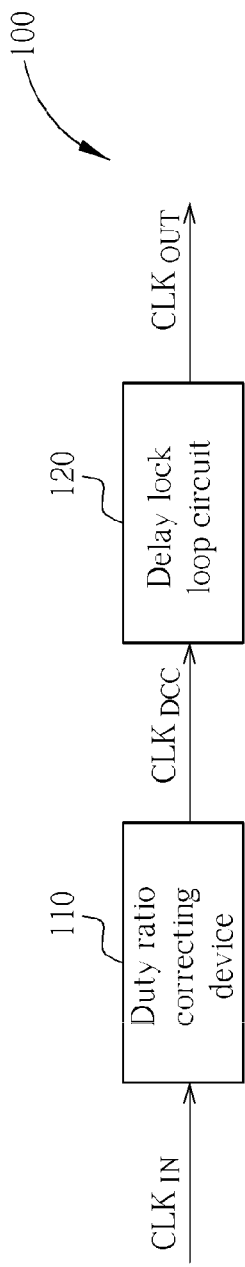
FIG. 1 is a diagram illustrating a conventional duty cycle correction circuit.
Figure 2:
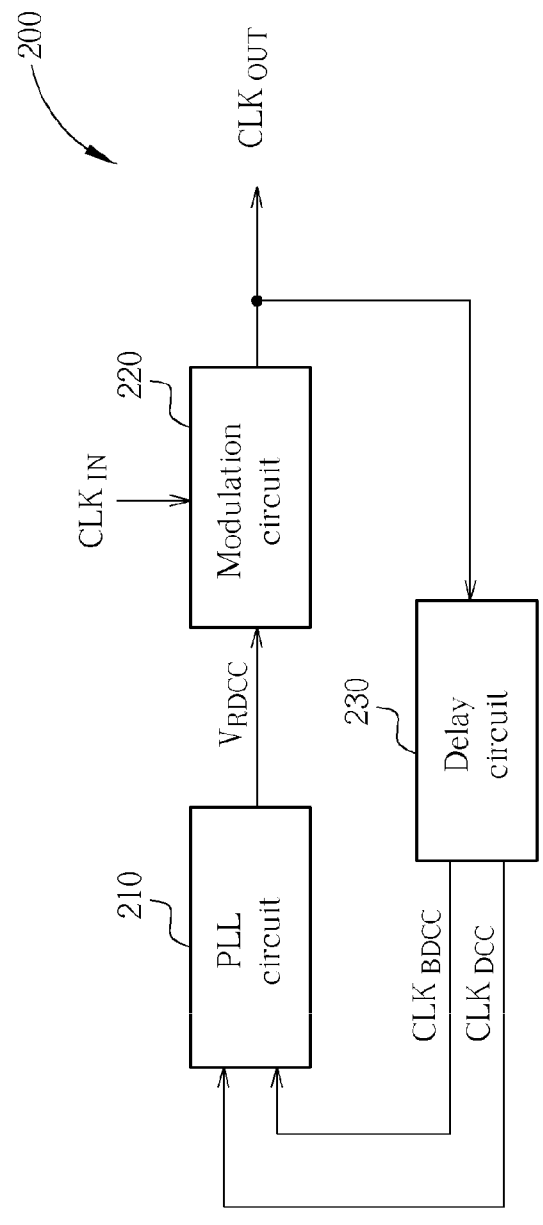
FIG. 2 is a diagram illustrating a duty cycle correction circuit according to the present invention.

Please refer to FIG. 2. FIG. 2 is a diagram illustrating a duty cycle correction circuit 200 according to the present invention. As shown in FIG. 2, the duty cycle correction circuit 200 comprises a phase lock loop (PLL) circuit 210, a modulation circuit 220, and a delay circuit 230.

The modulation circuit 220 is coupled to a clock generator (not shown) for receiving a reference clock signal $CLK_{IN}$, modulating the reference clock signal $CLK_{IN}$, and outputting the modulated reference clock signal as the output clock signal $CLK_{OUT}$. The duty cycle of the output clock signal $CLK_{OUT}$ is corrected to be 50%.

The delay circuit 230 is coupled to the modulation circuit 220 for receiving the output clock signal $CLK_{OUT}$, delaying the output clock signal $CLK_{OUT}$ by a predetermined period $T_{D2}$, and accordingly generating the corrected clock signals $CLK_{DCC}$ and $CLK_{BDCC}$. The corrected clock signals $CLK_{DCC}$ and $CLK_{BDCC}$ are inverted to each other.

PLL circuit 210 is coupled to the delay circuit 230 for receiving the corrected clock signals $CLK_{DCC}$ and $CLK_{BDCC}$ so as to estimate high-level and low-level statuses of the corrected clock signals $CLK_{DCC}$ and $CLK_{BDCC}$ and accordingly to generate the reference voltage $V_{RDCC}$, and to feed the reference voltage $V_{RDCC}$ back to the modulation circuit 220. The reference voltage $V_{RDCC}$ outputted from the PLL circuit 210 is provided to the modulation circuit 220 for correcting the duty cycle of the output clock signal $CLK_{OUT}$ to be 50%.

Figure 3:
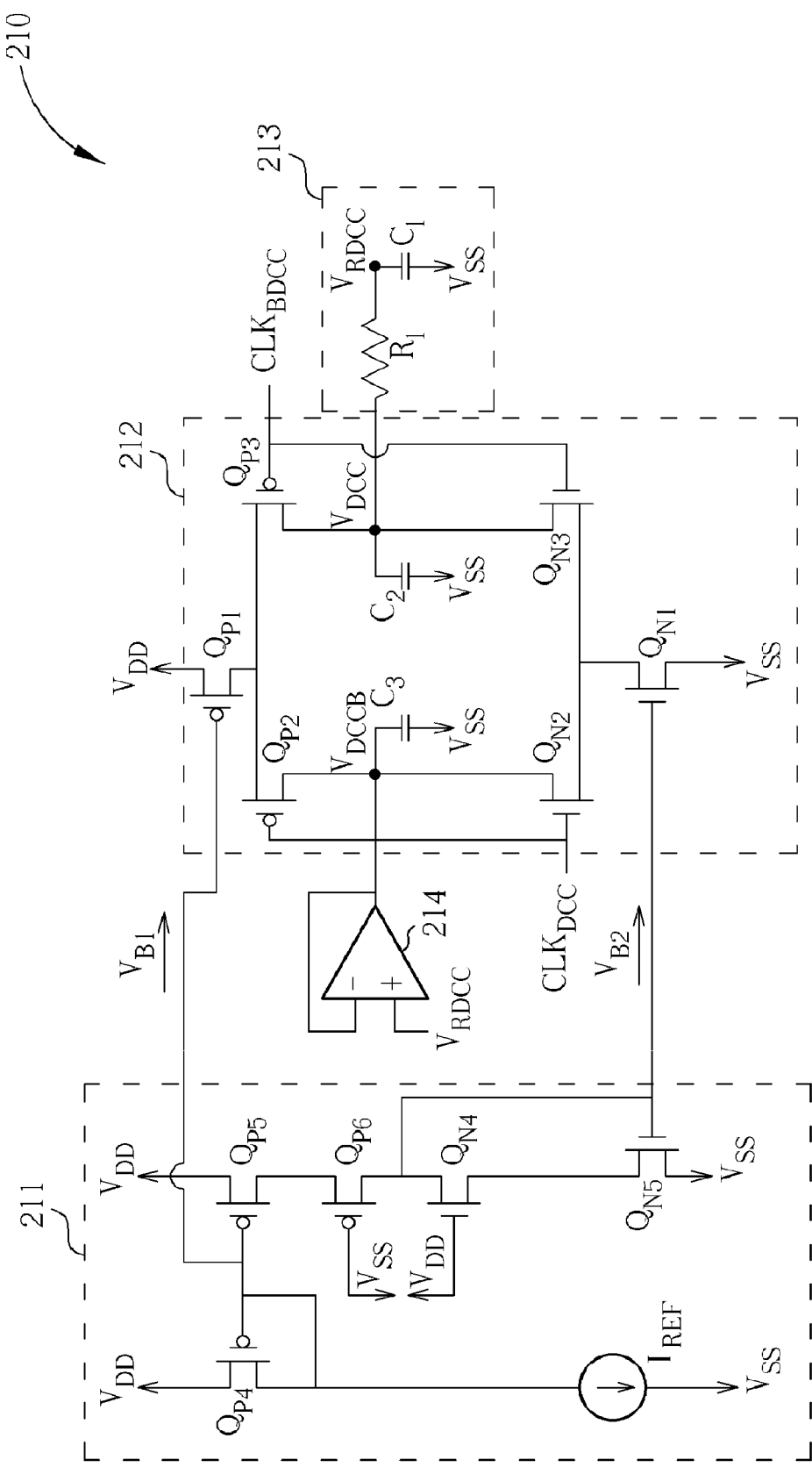
FIG. 3 is a diagram illustrating PLL circuit of the present invention.

Please refer to FIG. 3. FIG. 3 is a diagram illustrating PLL circuit 210 of the present invention. As shown in FIG. 3, the PLL circuit 210 comprises a bias circuit 211, a phase comparator 212, a low-pass filter 213, and an amplifier 214.

The bias circuit 211 comprises three P channel Metal Oxide Semiconductor (PMOS) transistors $Q_{P4}$, $Q_{P5}$, and $Q_{P6}$, and two N channel Metal Oxide Semiconductor (NMOS) transistors $Q_{N4}$ and $Q_{N5}$ for forming a current mirroring circuit. In this way, the current mirroring circuit generates a voltage signals $V_{B1}$ and $V_{B2}$ according to a reference current source $I_{REF}$ and provides the generated voltage signals $V_{B1}$ and $V_{B2}$ to the phase comparator 212 so as to drive the phase comparator 212.

The phase comparator 212 comprises two capacitors $C_2$ and $C_3$, three PMOS transistors $Q_{P1}$, $Q_{P2}$, and $Q_{P3}$, and three NMOS transistors $Q_{N1}$, $Q_{N2}$, and $Q_{N3}$. The first end of the transistor $Q_{P1}$ is coupled to the voltage source $V_{DD}$, the second end of the transistor $Q_{P1}$ is coupled to the first end of the transistor $Q_{P2}$ and the first end of the transistor $Q_{P3}$, and the control end of the transistor $Q_{P1}$ is coupled to the control end of the transistor $Q_{P5}$. The second end of the transistor $Q_{N1}$ is coupled to the voltage source $V_{SS}$ (ground), the first end of the transistor $Q_{N1}$ is coupled to the second end of the transistor $Q_{N2}$ and the second end of the transistor $Q_{N3}$, and the control end of the transistor $Q_{N1}$ is coupled to the control end of the transistor $Q_{N5}$. The first end of the transistor $Q_{P2}$ is coupled to the second end of the transistor $Q_{P1}$, the second end of the transistor $Q_{P2}$ is coupled to the first end of the transistor $Q_{N2}$, and the control end of the transistor $Q_{P2}$ is coupled to the delay circuit 230 for receiving the corrected clock signal $CLK_{DCC}$. The first end of the transistor $Q_{N2}$ is coupled to the second end of the transistor $Q_{P2}$, the second end of the transistor $Q_{N2}$ is coupled to the first end of the transistor $Q_{N1}$, and the control end of the transistor $Q_{N2}$ is coupled to the delay circuit 230 for receiving the corrected clock signal $CLK_{DCC}$. The first end of the transistor $Q_{P3}$ is coupled to the second end of the transistor $Q_{P1}$, the second end of the transistor $Q_{P3}$ is coupled to the first end of the transistor $Q_{N3}$, and the control end of the transistor $Q_{P3}$ is coupled to the delay circuit 230 for receiving the corrected clock signal $CLK_{BDCC}$. The first end of the transistor $Q_{N3}$ is coupled to the second end of the transistor $Q_{P3}$, the second end of the transistor $Q_{N3}$ is coupled to the first end of the transistor $Q_{N1}$, and the control end of the transistor $Q_{N3}$ is coupled to the delay circuit 230 for receiving the corrected clock signal $CLK_{BDCC}$. The capacitor $C_2$ is coupled between the second end of the transistor $Q_{N3}$ and the voltage source $V_{SS}$. The capacitor $C_3$ is coupled between the second end of the transistor $Q_{N2}$ and the voltage source $V_{SS}$. The transistors $Q_{P1}$ and $Q_{N1}$ are utilized as current sources for the phase comparator 212 and receive the voltage signals $V_{B1}$ and $V_{B2}$ from the bias circuit 211 respectively for driving the phase comparator 212. The capacitors $C_2$ and $C_3$ are utilized for estimating high-level and low-level statuses of the corrected clock signals $CLK_{BDCC}$ and $CLK_{DCC}$ respectively. Additionally, the capacitor $C_2$ is coupled to the low-pass filter 213, and the capacitor $C_3$ is coupled to the amplifier 214.

The low-pass filter 213 comprises a capacitor $C_1$ and a resistor $R_1$. The resistor $R_1$ of the low-pass filter 213 is coupled between the capacitor $C_2$ of the phase comparator 212 and the voltage source $V_{SS}$. The capacitors $C_2$ and $C_3$ are utilized for estimating high-level and low-level statuses of the corrected clock signals $CLK_{BDCC}$ and $CLK_{DCC}$. Consequently, the reference voltage $V_{RDCC}$ on the capacitor $C_1$ of the low-pass filter 213 can be determined by high-level and low-level statuses of the corrected clock signals $CLK_{BDCC}$ and $CLK_{DCC}$.

The positive end of the amplifier 214 is coupled to the capacitor $C_1$ for receiving the reference voltage $V_{RDCC}$, and the negative end of the amplifier 214 is coupled to the output end of the amplifier 214 to form a voltage follower. Thus, the voltage on the capacitor $C_3$ equals to the reference voltage $V_{RDCC}$. In this way, in the phase comparator 212, the voltage $V_{DCCB}$ is close to the voltage $V_{DCC}$.

Figure 4:
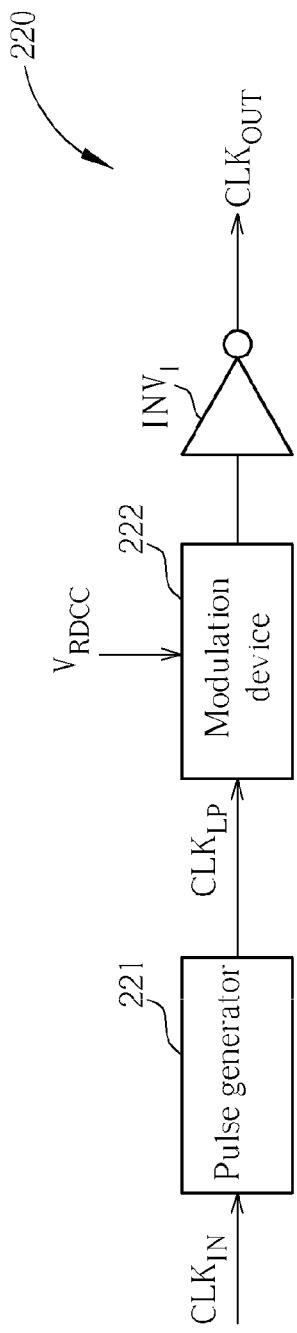
FIG. 4 is a diagram illustrating the modulation circuit of the present invention.

Please refer to FIG. 4. FIG. 4 is a diagram illustrating the modulation circuit 220 of the present invention. The modulation circuit 220 comprises a pulse generator 221, modulation device 222, and an inverter $INV_1$.

The pulse generator 221 is coupled to the clock signal generator (not shown) for receiving the reference clock signal $CLK_{IN}$, and generates a low-level pulse which starts at a high level to form a periodic low-level pulse signal $CLK_{LP}$.

The modulation device 222 receives the reference voltage $V_{RDCC}$, and prolongs the low-level status of the periodic low-level pulse signal $CLK_{LP}$ according to the reference voltage $V_{RDCC}$, wherein the low-level status of the periodic low-level pulse signal $CLK_{LP}$ equals to the high-level status of the output clock signal $CLK_{OUT}$, for correcting the duty cycle of the output clock signal $CLK_{OUT}$. Furthermore, reference voltage $V_{RDCC}$ generated from the PLL circuit 210 is fed back to the modulation device 222 so as to enable the delay time between the rising edges between the reference clock signal $CLK_{IN}$ and the output clock signal $CLK_{OUT}$ to be fixed and to be traceable.

Figure 5:
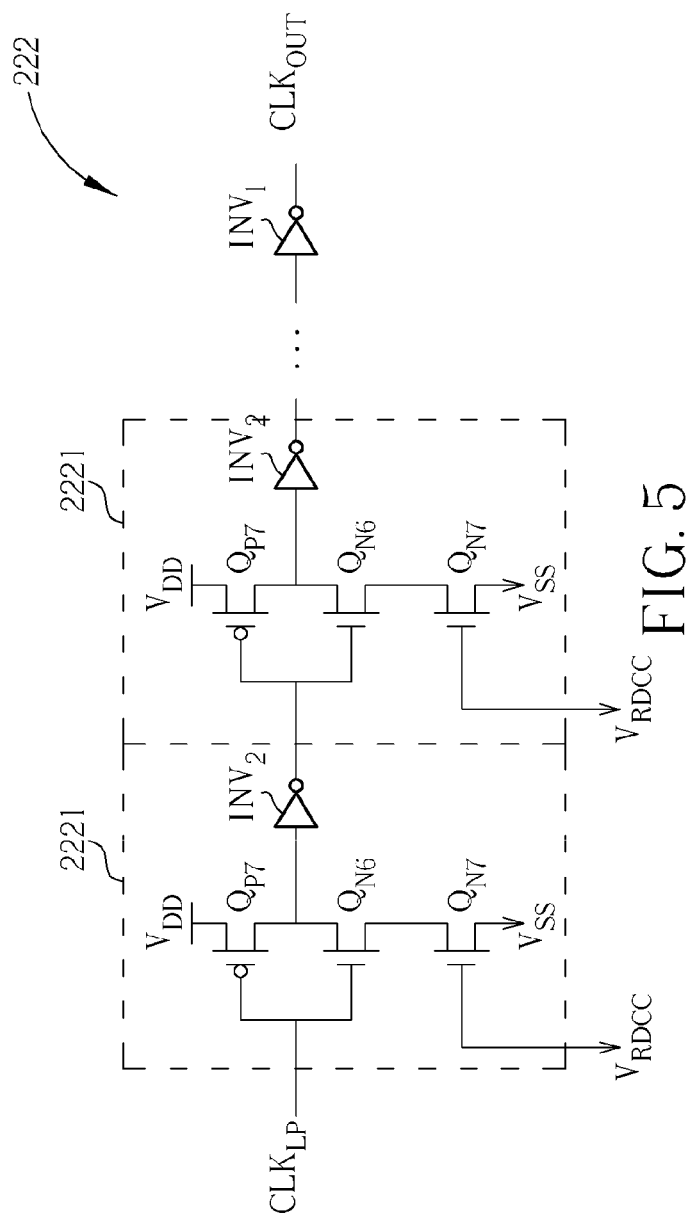
FIG. 5 is a diagram illustrating the modulation device of the present invention.

Please refer to FIG. 5. FIG. 5 is a diagram illustrating the modulation device 222 of the present invention. The modulation device 222 comprises an inverter $INV_1$ and at least one modulator 2221. The modulator 2221 comprises an inverter $INV_2$, a PMOS transistor $Q_{P7}$, and two NMOS transistors $Q_{N6}$ and $Q_{N7}$. The first end of the transistor $Q_{P7}$ is coupled to the voltage source $V_{DD}$, the second end of the transistor $Q_{P7}$ is coupled to the first end of the transistor $Q_{N6}$, and the control end of the transistor $Q_{P7}$ is coupled to the pulse generator 221 for receiving the periodic low-level pulse signal $CLK_{LP}$. The first end of the transistor $Q_{N6}$ is coupled to the second end of the transistor $Q_{P7}$, the second end of the transistor $Q_{N6}$ is coupled to the first end of the transistor $Q_{N7}$, and the control end of the transistor $Q_{N6}$ is coupled to the pulse generator 221 for receiving the periodic low-level pulse signal $CLK_{LP}$. The first end of the transistor $Q_{N7}$ is coupled to the second end of the transistor $Q_{N6}$, the second end of the transistor $Q_{N7}$ is coupled to the voltage source $V_{SS}$, and the control end of the transistor $Q_{N7}$ is coupled to the capacitor $C_1$ of the PLL circuit 210 for receiving the reference voltage $V_{RDCC}$. The input end of the inverter $INV_2$ is coupled to the second end of the transistor $Q_{P7}$ and the first end of the transistor $Q_{N6}$, and the output end of the inverter $INV_2$ is coupled to the input end of the modulator of the next stage or the input end of the inverter $INV_1$. The transistor $Q_{N7}$ adjusts the current sunk by the transistor $Q_{N7}$ according to the reference voltage $V_{RDCC}$ for prolonging the low-level status of the periodic low-level pulse signal $CLK_{LP}$, thereby generating the output clock signal $CLK_{OUT}$ having equal high-level and low-level statuses (50%/50%).

The number of the modulators 2221 can be determined according to the prolongation of the low-level status of the periodic low-level pulse signal $CLK_{LP}$ and should not be limited to one, and the plural modulators can be connected in series as shown in FIG. 5. In FIG. 5, the number of the modulators 2221 is set to be two. The output of the modulator 2221 of the last stage (the output end of the inverter $INV_2$) is coupled to the inverter $INV_1$. Therefore, the output clock signal $CLK_{OUT}$ outputted from the modulator(s) 2221 can be in phase with the reference clock signal $CLK_{IN}$ after being delayed by the period $T_{D1}$.

Figure 6:
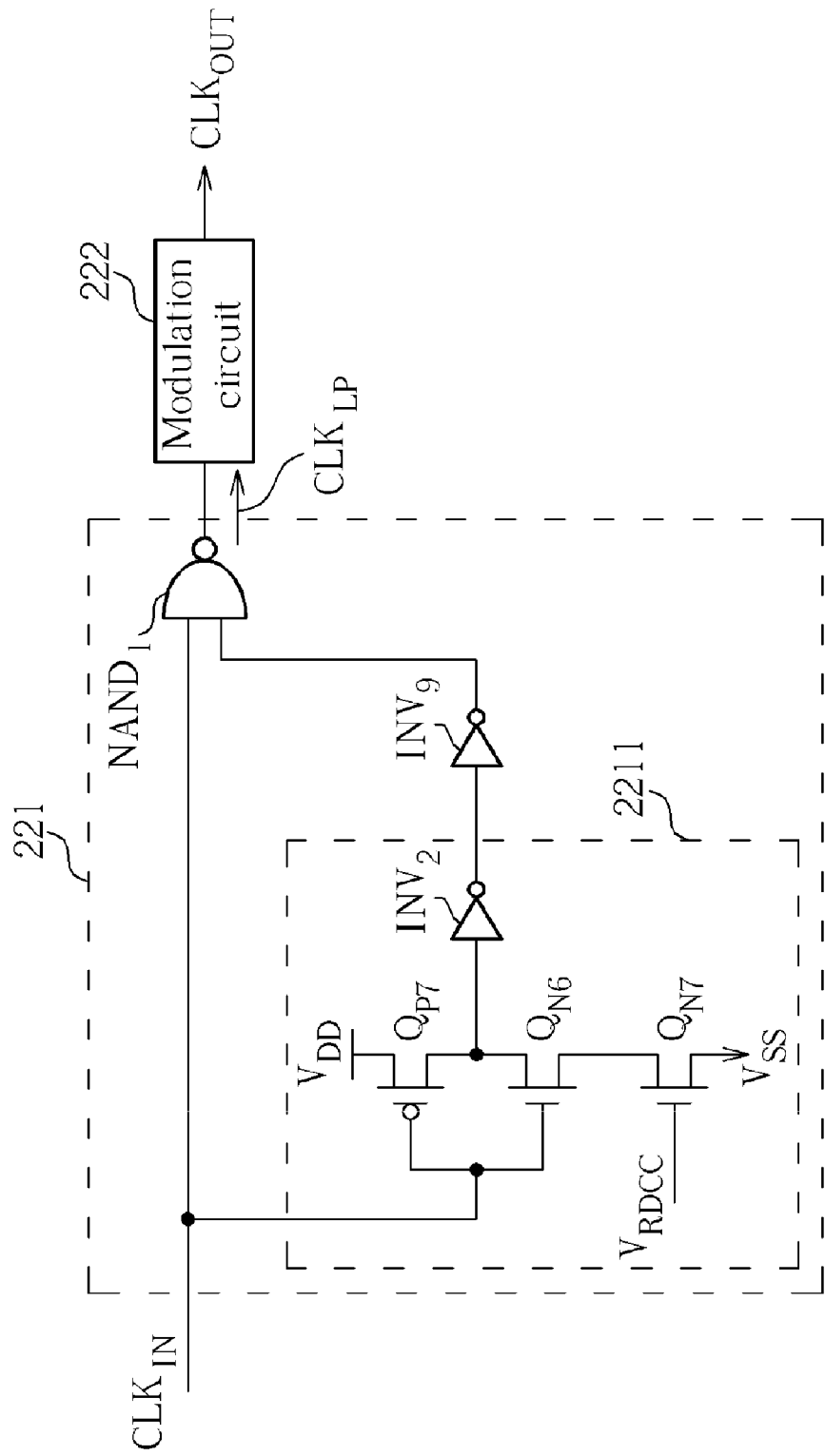
FIG. 6 is a diagram illustrating the pulse generator of the present invention.

Please refer to FIG. 6. FIG. 6 is a diagram illustrating the pulse generator 221 of the present invention. The pulse generator 221 comprises a NAND gate $NAND_1$, a modulator 2211, and an inverter $INV_9$. The first input end of the NAND gate $NAND_1$ is coupled to the clock signal generator (not shown) for receiving the reference clock signal $CLK_{IN}$, the second end of the NAND gate $NAND_1$ is coupled to the output end of the inverter $INV_9$, and the output end of the NAND gate $NAND_1$ outputs an NAND calculation result according to the input signals on the two input ends of the NAND gate $NAND_1$, which is utilized as the periodic low-level pulse signal $CLK_{LP}$. The modulator 2211 is coupled between the clock signal generator (not shown) and the second input end of the NAND gate $NAND_1$ for modulating the low-level status of the reference clock signal $CLK_{IN}$ and accordingly outputting the modulated reference clock signal $CLK_{IN}$ to the second input end of the NAND gate $NAND_1$. The structure of the modulator 2211 is similar to that of the modulator 2221, and therefore the related description is omitted. In the modulator 2211, the control end of the transistor $Q_{N7}$ is coupled to the capacitor $C_1$, and thus the current sunk by the transistor $Q_{N7}$ is controlled by the reference voltage $V_{RDCC}$ for prolonging the low-level status of the reference clock signal $CLK_{IN}$ and outputting the prolonged signal to the inverter $INV_9$.

The number of the modulators 2211 can be determined according to the prolongation of the low-level status of the reference clock signal $CLK_{IN}$ and should not be limited to one, and the plural modulators 2211 can be connected in series as shown in FIG. 6. The output of the modulator 2211 of the last stage (the output end of the inverter $INV_2$) is coupled to the inverter $INV_9$.

Figure 7:
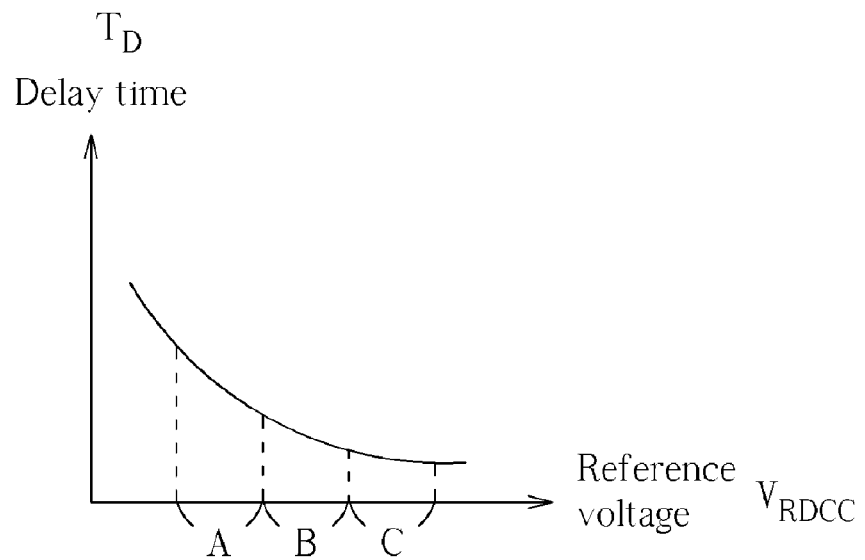
FIG. 7 is a timing diagram illustrating the relationship between the delay time and the reference voltage of the modulator of the present invention.

Please refer to FIG. 7. FIG. 7 is a timing diagram illustrating the relationship between the delay time and the reference voltage of the modulator of the present invention. When the reference voltage $V_{RDCC}$ rises, the delay time $T_D$ of the modulator becomes shorter. As shown in FIG. 7, the relationship between the reference voltage and the delay time can be divided into three sections along the direction of the reference voltage: sections A, B, and C where the slope is gradually decreased from sections A to C. In other words, in section A, the variation of the reference voltage $V_{RDCC}$ in section A has slighter effect on the delay time $T_D$ than that in section A. Therefore, when the used delay time $T_D$ falls within the range of section A, the stability of the reference voltage $V_{RDCC}$ becomes relatively critical since a slight change in the reference voltage $V_{RDCC}$ will cause a big change in the delay time $T_D$, which generates unacceptable errors. Because of the aforementioned reasons, the modulation device 222 and the pulse generator 221 utilize a plurality of modulators (connected in series) to achieve the required delay time instead of utilizing one single modulator and decreasing the reference voltage $V_{RDCC}$ of that single modulator. In this way, the required delay time is generated from the sum of the delay time of each of the plurality of modulators, thereby stabilizing the required delay time. Additionally, the number of the modulators disposed in the pulse generator 221 and the modulation device 222 can be designed as desired.

Figure 8:
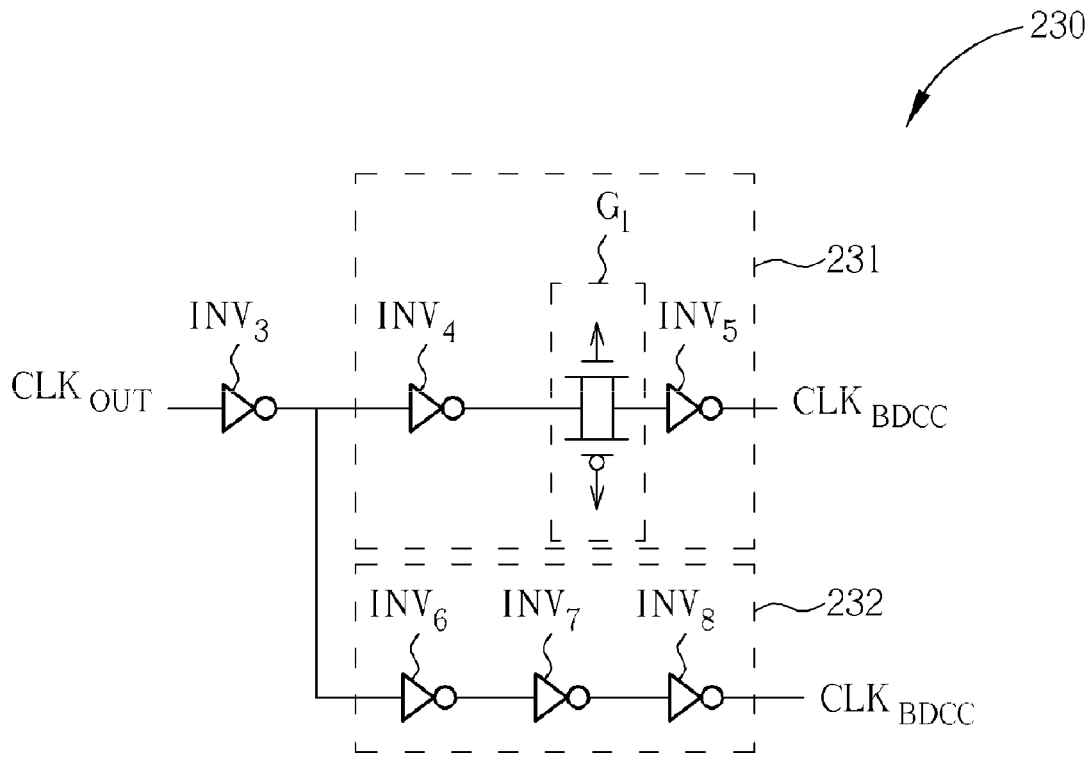
FIG. 8 is a diagram illustrating the delay circuit of the present invention.

Please refer to FIG. 8. FIG. 8 is a diagram illustrating the delay circuit 230 of the present invention. As shown in FIG. 8, the delay circuit 230 comprises an inverter $INV_3$, and two delay modules 231 and 232. The input end of the inverter $INV_3$ is coupled to the output end of the modulation circuit 220 for receiving the output clock signal $CLK_{OUT}$ and accordingly inverting the output clock signal $CLK_{OUT}$. The delay module 231 comprises two inverters $INV_4$ and $INV_5$, and a delay unit $G_1$. The delay unit $G_1$ can be realized with a transistor functioning for generating the same delay time as the inverter. In the delay module 231, the input end of the inverter $INV_4$ is coupled to the output end of the inverter $INV_3$; the delay unit $G_1$ is coupled between the inverters $INV_4$ and $INV_5$; the inverter $INV_5$ outputs the corrected clock signal $CLK_{BDCC}$. The delay module 232 comprises three inverters $INV_6$, $INV_7$, and $INV_8$. In the delay module 232, the input end of the inverter $INV_6$ is coupled to the output end of the inverter $INV_3$; the inverter $INV_7$ is coupled between the inverters $INV_6$ and $INV_8$; the inverter $INV_8$ outputs the corrected clock signal $CLK_{DCC}$. Therefore, the corrected clock signals $CLK_{DCC}$ and $CLK_{BDCC}$ are inverted to each other, and both of the corrected clock signals $CLK_{DCC}$ and $CLK_{BDCC}$ are delayed than the output clock signal $CLK_{OUT}$ by a predetermined period $T_{D2}$. The predetermined period $T_{D2}$ is the total propagation time through the four inverters as shown in FIG. 7. The predetermined period $T_{D2}$ can be adjusted by adjusting the number of the inverters as desired.

Figure 9:
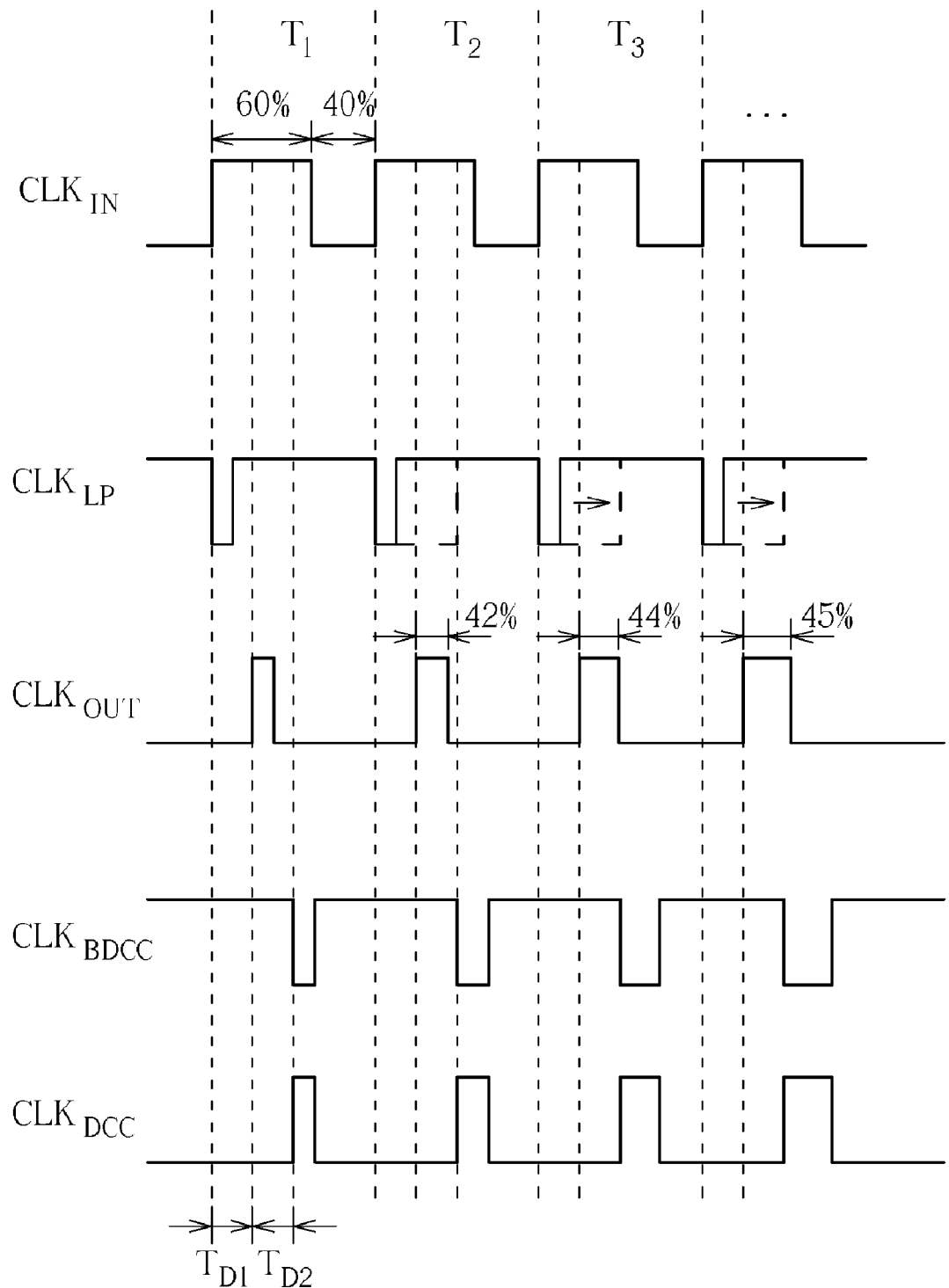
FIG. 9 is a timing diagram illustrating the duty cycle correction circuit of the present invention.

Please refer to FIG. 9. FIG. 9 is a timing diagram illustrating the duty cycle correction circuit 200 of the present invention. As shown in FIG. 9, the high-level status of the reference clock signal $CLK_{IN}$ is 60% (duty cycle), which is greater than the low-level status of the reference clock signal $CLK_{IN}$. The periodic low-level pulse signal $CLK_{LP}$ is generated when the modulation circuit 220 is triggered by the rising edges of the reference clock signal $CLK_{IN}$. At the first cycle $T_1$ of the reference clock signal $CLK_{IN}$, since the reference voltage $V_{RDCC}$ is not generated yet, the modulation device 222 does not modulate the low-level status of the periodic low-level pulse signal $CLK_{LP}$. After the delay time $T_{D1}$, the output clock signal $CLK_{OUT}$ is changed with a high-level pulse by the periodic low-level pulse signal $CLK_{LP}$ and the inverter $INV_1$. After the delay time $T_{D2}$, the corrected clock signal $CLK_{BDCC}$ is changed with a low-level pulse and the corrected clock signal $CLK_{DCC}$ is changed with a high-level pulse by the output clock signal $CLK_{OUT}$ and the delay circuit 230. At the second cycle $T_2$ of the reference clock signal $CLK_{IN}$, the modulation device 222 receives the reference voltage $V_{RDCC}$ from the PLL circuit 210, and accordingly prolongs the low-level status of the periodic low-level pulse signal $CLK_{LP}$. After few cycles, the duty cycle of the output clock signal $CLK_{OUT}$ generated from the inverter $INV_1$ is corrected to be 50%, and therefore the duty cycles of the corrected clock signals $CLK_{BDCC}$ and $CLK_{DCC}$ generated by the corrected output clock signal $CLK_{OUT}$ and the delay circuit 230 are 50% as well.

To sum up, the duty cycle correction circuit provided by the present invention is capable of tracing the delay time between the received reference clock signal and the corrected output clock signal, and reducing the jitter of the output clock signal. Furthermore, by utilizing the pulse generator having adjustable pulse width, the applicable frequency range of the duty cycle correction circuit can be increased, providing greater convenience.

Those skilled in the art will readily observe that numerous modifications and alterations of the device and method may be made while retaining the teachings of the invention.

What is claimed is:

1. A duty cycle correction circuit with wide-frequency working range, the duty cycle correction circuit receiving a reference clock signal from a clock generator and correcting duty cycle of the received reference clock signal for outputting an output clock signal, the duty cycle correction circuit comprising:
a modulation circuit, comprising:
a pulse generator, comprising:
a NAND gate, comprising:
a first input end, coupled to the clock generator;
a second input end; and
an output end for outputting a periodic low-level pulse signal; and
a first modulator, coupled between the clock generator and the second input end of the NAND gate, for modulating low-level status of the reference clock signal according to a reference voltage and accordingly outputting the modulated reference clock signal to the second input end of the NAND gate; and
a modulation device, comprising at least one second modulator coupled to the output end of the NAND gate for modulating low-level status of the periodic low-level pulse signal according to the reference voltage and accordingly outputting the modulated periodic low-level pulse signal as the output clock signal;
a delay circuit coupled to one output end of the modulation device for delaying the output clock signal by a predetermined period and accordingly outputting a first corrected clock signal and a second corrected clock signal;
wherein the first corrected clock signal and the second corrected clock signal are inverted to each other; and
a Phase Lock Loop (PLL) circuit, coupled to the delay circuit, for estimating high-level status and low-level status of the first corrected clock signal and the second corrected clock signal and accordingly generating the reference voltage.

2. The duty cycle correction circuit of claim 1, wherein the first modulator comprising:
a first transistor, comprising:
a first end, coupled to a first voltage source;
a control end, coupled to the clock generator; and
a second end, coupled to the second input end of the NAND gate;
a second transistor, comprising:
a first end, coupled to the second end of the first transistor;
a control end, coupled to the clock generator; and
a second end; and
a third transistor, comprising:
a first end, coupled to the second end of the second transistor;
a control end, coupled to the PLL circuit, for receiving the reference voltage; and
a second end, coupled to a second voltage source.

3. The duty cycle correction circuit of claim 2, wherein the first transistor is a P channel Metal Oxide Semiconductor (PMOS) transistor; the second and the third transistors are N channel Metal Oxide Semiconductor (NMOS) transistors.

4. The duty cycle correction circuit of claim 2, wherein the first modulator further comprises a first inverter coupled between the second end of the first transistor and the second input end of the NAND gate.

5. The duty cycle correction circuit of claim 4, wherein the pulse generator further comprises a second inverter coupled between the first inverter and the second input end of the NAND gate.

6. The duty cycle correction circuit of claim 1, wherein the second modulator of the modulation device comprises:
a fourth transistor, comprising:
a first end, coupled to the first voltage source;
a control end, coupled to the output end of the NAND gate; and
a second end, coupled to the delay circuit;
a fifth transistor, comprising:
a first end, coupled to the second end of the fourth transistor;
a control end, coupled to the output end of the NAND gate; and
a second end; and
a sixth transistor, comprising:
a first end, coupled to the second end of the fifth transistor;
a control end, coupled to the PLL circuit, for receiving the reference voltage; and
a second end, coupled to a second voltage source.

7. The duty cycle correction circuit of claim 6, wherein the fourth transistor is a P channel Metal Oxide Semiconductor (PMOS) transistor; the fifth and the sixth transistors are N channel Metal Oxide Semiconductor (NMOS) transistors.

8. The duty cycle correction circuit of claim 6, wherein the second modulator further comprises a third inverter, coupled between the second end of the fourth transistor and the delay circuit.

9. The duty cycle correction circuit of claim 8, wherein the modulation circuit further comprises a fourth inverter coupled between the third inverter and the delay circuit.

10. The duty cycle correction circuit of claim 1, wherein the delay circuit comprises:
a fifth inverter, coupled to the clock generator;
a first delay module, comprising:
M sixth inverters coupled in series;
wherein the first sixth inverter is coupled to the fifth inverter, and the $M^{th}$ sixth inverter outputs the first corrected clock signal; and
a second delay module, comprising:
N seventh inverters coupled in series;
Wherein the first seventh inverter is coupled to the fifth inverter; and
A delay unit, coupled between the $(P-1)^{th}$ seventh inverter and the $P^{th}$ seventh inverter for outputting the second corrected clock signal;
Wherein P, N, and M are positive integers, P is not greater than N, and N is not greater than M, and the first delay module and the second delay module delays for the predetermined period.

11. The duty cycle correction circuit of claim 10, wherein the PLL circuit comprises:
a phase comparator, coupled to the first delay module and the second delay module, for estimating high-level and low-level statuses of the first corrected clock signal and the second corrected clock signal; and
a low-pass filter, coupled to the phase comparator, for outputting the reference voltage according to result of the phase comparator.

12. The duty cycle correction circuit of claim 11, wherein the PLL circuit further comprises a bias circuit for outputting a first voltage signal and a second voltage signal according to a reference current source to the phase comparator.

13. The duty cycle correction circuit of claim 12, wherein the phase comparator comprises:
   a seventh transistor, comprising:
      a first end, coupled to a first voltage source;
      a control end, for receiving the first voltage signal; and
      a second end;
   an eighth transistor, comprising:
      a first end, coupled to the second end of the seventh transistor;
      a control end, coupled to the first delay module, for receiving the first corrected clock signal; and
      a second end;
   a ninth transistor, comprising:
      a first end, coupled to the second end of the seventh transistor;
      a control end, coupled to the second delay module, for receiving the second corrected clock signal; and
      a second end;
   a tenth transistor, comprising:
      a first end, coupled to the second end of the eighth transistor;
      a control end, coupled to the first delay module, for receiving the first corrected clock signal; and
      a second end;
   an eleventh transistor, comprising:
      a first end, coupled to the second end of the ninth transistor;
      a control end, coupled to the second delay module, for receiving the second corrected clock signal; and
      a second end;
   a twelfth transistor, comprising:
      a first end, coupled to the second end of the tenth transistor and the second end of the eleventh transistor;
      a control end, for receiving the second voltage signal; and
      a second end;
   a first capacitor, coupled between the second end of the eighth transistor and the second voltage source; and
   a second capacitor, coupled between the second end of the ninth transistor and the second voltage source.

14. The duty cycle correction circuit of claim 13, wherein the seventh, the eighth, and the ninth transistors are PMOS transistors; the tenth, the eleventh, and the twelfth transistors are NMOS transistors.

15. The duty cycle correction circuit of claim 13, wherein the low-pass filter comprises:
   a resistor, coupled to the second capacitor; and
   a third capacitor, coupled between the resistor and the second voltage source, for outputting the reference voltage.

16. The duty cycle correction circuit of claim 15, wherein the PLL circuit further comprises an amplifier, the amplifier comprising:
   a positive input end, coupled to the third capacitor, for receiving the reference voltage;
   an output end, coupled to the first capacitor; and
   a negative input end, coupled to the output end of the amplifier.

17. A duty cycle correction circuit for correcting duty cycle of a reference clock signal so as to generate an output clock signal, the duty cycle correction circuit comprising:
   a modulation circuit, receiving the reference clock signal, for generating the output clock signal according to a reference voltage;
   a delay circuit for generating a first corrected clock signal and a second corrected clock signal according to the output clock signal;
   wherein the first corrected clock signal and the second corrected clock signal are inverted to each other; and
   a PLL circuit, coupled to the delay circuit, for generating the reference voltage according to the first corrected clock signal and the second corrected clock signal;
   wherein the modulation circuit comprises a pulse generator and a modulation device, the pulse generator generates a low-level pulse signal according to the reference clock signal and the reference voltage, and the modulation device generates the output clock signal according to the low-level pulse signal and the reference clock signal.

18. The duty cycle correction circuit of claim 17, wherein duty cycle of the output clock signal is approximately 1.

19. The duty cycle correction circuit of claim 17, wherein the pulse generator comprises:
   a first modulator for modulating low-level status of the reference clock signal according to the reference voltage and outputting the modulated reference clock signal as a transient pulse signal; and
   a logic circuit for generating the low-level pulse signal according to the transient pulse signal and the reference clock signal.

20. The duty cycle correction circuit of claim 19, wherein the logic circuit is a NAND gate, and the NAND gate operates NAND calculation on the transient pulse signal and the reference clock signal for generating the low-level pulse signal.

* * * * *